(12) United States Patent
Wang et al.

(10) Patent No.: US 8,907,434 B2
(45) Date of Patent: Dec. 9, 2014

(54) MEMS INERTIAL SENSOR AND METHOD FOR MANUFACTURING THE SAME

(71) Applicant: Lexvu Opto Microelectronics Technology (Shanghai) Ltd., Shanghai (CN)

(72) Inventors: Zhiwei Wang, Shanghai (CN); Deming Tang, Shanghai (CN); Lei Zhang, Shanghai (CN); Jianhong Mao, Shanghai (CN); Fengqin Han, Shanghai (CN)

(73) Assignee: Lexvu Opto Microelectronics Technology (Shanghai) Ltd., Shanghai (CN)

( * ) Notice: Subject to any disclaimer, the term of this patent is extended or adjusted under 35 U.S.C. 154(b) by 50 days.

(21) Appl. No.: 13/870,533

(22) Filed: Apr. 25, 2013

(65) Prior Publication Data

US 2013/0285168 A1 Oct. 31, 2013

(30) Foreign Application Priority Data

Apr. 26, 2012 (CN) .......................... 2012 1 0126539

(51) Int. Cl.
*H01L 29/84* (2006.01)
*H01L 21/00* (2006.01)
*B81C 1/00* (2006.01)
*B81B 3/00* (2006.01)
*G01P 15/125* (2006.01)
*G01C 19/5783* (2012.01)

(52) U.S. Cl.
CPC ........... *B81C 1/00134* (2013.01); *B81B 3/0018* (2013.01); *B81C 1/00293* (2013.01); *B81B 2201/025* (2013.01); *B81C 2203/0145* (2013.01); *G01P 15/125* (2013.01); *G01C 19/5783* (2013.01)

USPC ........... 257/415; 257/416; 257/417; 257/774; 257/E21.002; 257/E21.158; 257/E29.324; 257/E31.11; 381/174; 438/49; 438/50; 438/53; 438/54

(58) Field of Classification Search
CPC ........................... B81C 1/00134; B81B 3/0018
USPC .................. 257/415, 416, 417, 774, E21.002, 257/E21.158, E29.324, E31.11; 381/174; 438/49, 50, 53, 54
See application file for complete search history.

(56) References Cited

U.S. PATENT DOCUMENTS

| | | | |
|---|---|---|---|
| 7,898,046 B2 * | 3/2011 | Ulm et al. | 257/415 |
| 2012/0261830 A1 * | 10/2012 | Chu et al. | 257/774 |
| 2013/0221453 A1 * | 8/2013 | Dehe et al. | 257/415 |
| 2013/0277771 A1 * | 10/2013 | Chou et al. | 257/415 |
| 2013/0277774 A1 * | 10/2013 | Frey et al. | 257/415 |

* cited by examiner

*Primary Examiner* — Dao H Nguyen
(74) *Attorney, Agent, or Firm* — Harness, Dickey & Pierce, P.L.C.

(57) ABSTRACT

A MEMS inertial sensor and a method for manufacturing the same are provided. The method includes: depositing a first carbon layer on a semiconductor substrate; patterning the first carbon layer to form a fixed anchor bolt, an inertial anchor bolt and a bottom sealing ring; forming a contact plug in the fixed anchor bolt and a contact plug in the inertial anchor bolt; forming a first fixed electrode, an inertial electrode and a connection electrode on the first carbon layer, where the first fixed electrode and the inertial electrode constitute a capacitor; forming a second carbon layer on the first fixed electrode and the inertial electrode; and forming a sealing cap layer on the second carbon layer and the top sealing ring. Under an inertial force, only the inertial electrode may move, the fixed electrode will almost not move or vibrate, which improves the accuracy of the MEMS inertial sensor.

20 Claims, 6 Drawing Sheets

US 8,907,434 B2

MEMS INERTIAL SENSOR AND METHOD FOR MANUFACTURING THE SAME

CROSS REFERENCE TO RELATED APPLICATIONS

The present application claims priority to Chinese patent application No. 201210126539.2, filed on Apr. 26, 2012, and entitled "MEMS INERTIAL SENSOR AND METHOD FOR MANUFACTURING THE SAME", the entire disclosure of which is incorporated herein by reference.

FIELD OF THE DISCLOSURE

The present invention generally relates to an inertial sensor and a method for manufacturing the same, and more particularly, to a silicon based capacitive micro electro mechanical structure (MEMS) inertial sensor.

BACKGROUND

MEMS devices generally include a single or composite micro-mechanical structure, which not only have electrical function, but also have mechanical, chemical, optical and biological function. An integrated system including a MEMS device and a semiconductor circuit can achieve a particular function. MEMS devices are widely applied in sensors or controlling systems, or for driving mechanical, optical or chemical movement in micro movement field. MEMS devices can also be used as an independent unit or system. A kind of widely used MEMS devices or systems measure inertia forces by translation, rotation or inertial sensing, such as MEMS acceleration sensors, gyroscopes.

A conventional capacitive MEMS inertial sensor includes a pair of inertial electrodes and a pair of fixed electrodes. A major portion of an inertial electrode hangs over a carrier of the device, and a small portion of an inertial electrode is fixed on the carrier. The fixed electrodes which are opposite to the inertial electrodes are fixed on the carrier and are required to have a great rigidity. There are narrow air gaps formed between the inertial electrodes, especially the portions hanging over the carrier, and the fixed electrodes, which form a pair of capacitors.

When an inertial force is provided in a certain direction, the potions of the inertial electrodes hanging over the carrier moves along the direction of the inertial force, that is, moves relative to the fixed electrodes, which changes the capacitance of the capacitors formed by the inertial electrodes and the fixed electrodes. By measuring the capacitance change, the movement between the inertial electrodes and the fixed electrodes may be obtained, and so does the inertial force. Therefore, capacitive MEMS inertial sensors are widely used in automobile industry, manufacture, consumer products industry and handheld electronic devices, nowadays. The conventional MEMS inertial sensors are mostly formed with bulk silicon MEMS, thick or thin silicon-on-insulator (SOI) manufacturing process, in which one or more suspended inertial electrodes are connected to a carrier, and inertial electrodes and fixed electrodes opposite to the inertial electrodes are isolated with air gaps.

Compared with the inertial electrodes, the fixed electrodes should have a great rigidity, so that under an inertial force, the fixed electrodes remain static or move a very little distance, thereby ensuring the accuracy of calculation the inertial force by measuring the capacitance change caused by the movement of the inertial electrodes. However, due to the limitations of the manufacturing process, it is difficult to fix a whole fixed electrode to the carrier in a conventional MEMS inertial sensor, and only a portion of the fixed electrode can be fixed on the carrier, thus the fixed electrode is still elastic and deformable and may move wholly or partly under the inertial force. Therefore, although having different rigidity and dynamic characteristics, both of the inertial electrode and the fixed electrode will move or vibrate. Then, the change in capacitance between the inertial electrode and the fixed electrode depends on the changes in position of the inertial electrode and the fixed electrode, rather than the distance the inertial electrode moves to the carrier, which may adversely influence the accuracy of the MEMS inertial sensor.

The process for manufacturing the conventional inertial sensor includes: forming a sacrificial layer before forming an inertial electrode and a fixed electrode, selectively removing a portion of the sacrificial layer after forming the inertial layer, so that the inertial electrode is suspended, and removing a portion of the sacrificial layer beneath the inertial electrode and the fixed electrode, so that a portion of the fixed electrode opposite to the inertial electrode is also suspended. Due to limitations of the manufacturing process, the fixed electrode can not be entirely fixed on the carrier, and only a fixing portion of the fixed electrode may be fixed on the carrier, which may cause a deformation relative to the carrier under an inertial force. The deformation may adversely affect the measurement of the capacitance and thus the measurement of the inertial force. Without regard to it, the deformation of the fixed electrode will become a dynamic noise and may cause measuring errors. Therefore, the deformation of the fixed electrode limits the accuracy of the conventional MEMS inertial sensor.

Nowadays, the MEMS inertial sensor are manufactured with an optimized process, such as, integrated with a CMOS readout integrated circuit (ROIC) on a same semiconductor substrate, so that the MEMS inertial sensor is embedded in the CMOS circuits. Compared with the traditional process in which MEMS devices are separately manufactured with ROIC, the optimized process may reduce the size, weight and power consumption of the MEMS devices, and improve the efficiency of the application system.

However, it is difficult to form a capacitive MEMS inertial sensor on a substrate including CMOS RIOC, especially on a thin silicon substrate compatible with the CMOS process.

SUMMARY

Embodiments of the present disclosure provide a MEMS inertial sensor with higher accuracy and a manufacturing method thereof.

In one aspect, there is provided a method for manufacturing a MEMS inertial sensor, including:
  providing a semiconductor substrate including a first dielectric layer, a bottom induction interconnect pad and a bottom reference interconnect pad embedded at the top of the first dielectric layer;
  depositing a first carbon layer on the first dielectric layer as a sacrificial layer;
  patterning the first carbon layer to form a plurality of openings therein.
  depositing a second dielectric layer on the first carbon layer and removing a portion of the second dielectric layer on the first carbon layer by chemical mechanical polishing (CMP), wherein the remaining second dielectric layer in the openings forms a fixed anchor bolt, an inertial anchor bolt and a bottom sealing ring;
  selectively etching the fixed anchor bolt and the inertial anchor bolt, so as to form an opening in the fixed anchor bolt which exposes the bottom induction interconnect pad and an opening in the inertial anchor bolt which exposes the bottom reference interconnect pad;

filling the openings with a conductive material to form contact plugs and depositing a conductive layer on the first carbon layer, the fixed anchor bolt, the inertial anchor bolt and the contact plugs;

selectively etching the conductive layer to form a first fixed electrode, an inertial electrode and a connection electrode which is connected to the inertial electrode, wherein the first fixed electrode and the inertial electrode constitute a capacitor, and the connection electrode works as a support body for the inertial electrode; the first fixed electrode is arranged on and connected to the fixed anchor bolt, and is electrically connected to the bottom induction interconnect pad through the contact plug in the fixed anchor bolt; the connection electrode is connected to the inertial anchor bolt and is electrically connected to the bottom reference interconnect pad through the contact plug in the inertial anchor bolt;

forming a MEMS peripheral support body on the bottom sealing ring;

forming a second carbon layer on the first fixed electrode, the inertial electrode, the connection electrode and a portion of the MEMS peripheral support body, and forming a top sealing ring surrounding the second carbon layer and on a portion of the MEMS peripheral support body;

forming a sealing cap layer on the second carbon layer and the top sealing ring, and etching the sealing cap layer to form an opening therein;

removing the first carbon layer and the second carbon layer through the opening in the sealing cap layer; and filling the opening in the sealing cap layer.

In one embodiment, the step of filling the openings with a conductive material to form contact plugs and the step of depositing a conductive layer on the first carbon layer, the fixed anchor bolt, the inertial anchor bolt and the contact plugs are performed in a same step, that is, depositing a conductive layer on the first carbon layer, the fixed anchor bolt, the inertial anchor bolt and the exposed bottom induction interconnect pad and bottom reference interconnect pad.

In one embodiment, the step of depositing a conductive layer on the first carbon layer, the fixed anchor bolt, the inertial anchor bolt and the exposed bottom induction interconnect pad and bottom reference interconnect pad includes:

filling the openings with a conductive material to form a contact plug in the fixed anchor bolt and a contact plug in the inertial anchor bolt; and depositing a conductive layer on the first carbon layer, the fixed anchor bolt, the inertial anchor bolt and the contact plugs.

In one embodiment, the first fixed electrode and the inertial electrode each has a finger structure which comprises a finger portion having fingers parallel to each other and a connection portion connected to the finger portion, where the fingers of the first fixed electrode and the fingers of the inertial electrode are disposed in an alternative and opposite manner and form an interdigitated structure.

In one embodiment, at least two fingers of the inertial electrode are arranged in two adjacent fingers of the first fixed electrode, or at least two fingers of the first fixed electrode are arranged in two adjacent fingers of the inertial electrode.

In one embodiment, a second fixed electrode is arranged in a direction that the inertial electrode is perpendicular to a surface of the semiconductor substrate, and the second fixed electrode and the inertial electrode constitute a capacitor which is perpendicular to the surface of the semiconductor substrate.

In one embodiment, the conductive layer is made of a silicon-containing conductive material and is formed by chemical vapor deposition (CVD) or physical vapor deposition (PVD), and the first and second dielectric layers are made of a silicon-containing dielectric material and are formed by CVD or PVD.

In one embodiment, the silicon-containing conductive material is polysilicon and is formed by CVD or PVD at a temperature lower than 450° C.

In one embodiment, the conductive layer comprises germanium-containing polysilicon and is formed by low pressure CVD at a temperature lower than 450° C.

In one embodiment, the semiconductor substrate further includes a silicon substrate and a CMOS device layer formed on the silicon substrate, where the CMOS device layer comprises a monocrystal silicon or metal-oxide-silicon transistor device formed therein.

In one embodiment, the conductive layer is a single layer including titanium alloy, or a multi-layer including titanium alloy, or a multi-layer including titanium and a dielectric material, or a multi-layer including aluminium alloy, or a multi-layer including aluminium and a dielectric material, and is formed by CVD, or PVD, or both.

In another aspect, there is provided a MEMS inertial sensor, including:

a semiconductor substrate comprising a first dielectric layer, a bottom induction interconnect pad and a bottom reference interconnect pad embedded at the top of the first dielectric layer;

a bottom dielectric sealing layer on the first dielectric layer including a bottom sealing ring arranged at a position corresponding to a periphery of the semiconductor substrate, where one or more fixed anchor bolts and an inertial anchor bolt are arranged in the bottom sealing ring, at least one fixed anchor bolt is electrically connected to the bottom induction interconnect pad, and the inertial anchor bolt is electrically connected to the bottom reference interconnect pad;

an inertial electrode, a connection electrode and a first fixed electrode arranged on the bottom dielectric sealing layer, where the inertial electrode and the first fixed electrode which are opposite to each other constitute a capacitor; the inertial electrode is connected to the connection electrode and hangs over the semiconductor substrate supported by the connection electrode which is arranged on the inertial anchor bolt and is electrically connected to the bottom reference interconnect pad; the first fixed electrode is arranged on the fixed anchor bolt;

a MEMS peripheral support body which is connected to the bottom sealing ring arranged at a position corresponding to the bottom sealing ring;

a top sealing ring on the MEMS peripheral support body; and a sealing cap layer on the top sealing ring, the first fixed electrode, the inertial electrode and the connection electrode;

wherein a sealed cavity is formed with the sealing cap layer, the top sealing ring, the MEMS peripheral support body, the bottom sealing ring and the semiconductor substrate; under an inertial force, the inertial electrode may move along a direction perpendicular to a surface of the semiconductor substrate or along a direction perpendicular to a surface of the first fixed electrode which is opposite to the inertial electrode?, which makes the capacitance between the inertial electrode and the first fixed electrode change.

In one embodiment, at least one fixed anchor bolt includes a contact plug formed therein which is connected to the bottom induction interconnect pad, and the inertial anchor bolt includes a contact plug formed therein which is connected to the bottom reference interconnect pad.

In one embodiment, the fixed anchor bolt and the first fixed electrode have a same material and constitute an integrated structure, and the inertial anchor bolt and the connection electrode have a same material and constitute an integrated structure.

In one embodiment, the first fixed electrode and the inertial electrode have a finger structure which includes a finger portion having multiple fingers parallel to each other and a connection portion which is connected to the finger portion. The fingers of the first fixed electrode and the fingers of the inertial electrode are disposed in an alternative and opposite manner and have an interdigitated structure.

In one embodiment, at least two fingers of the inertial electrode are arranged in two adjacent fingers of the first fixed electrode, or at least two fingers of the first fixed electrode are arranged in two adjacent fingers of the inertial electrode.

In one embodiment, a second fixed electrode is arranged in a direction that the inertial electrode is perpendicular to a surface of the semiconductor substrate and embedded at the top of the first dielectric layer, and the second fixed electrode and the inertial electrode constitute a capacitor which is perpendicular to the surface of the semiconductor substrate.

In one embodiment, the conductive layer is made of a silicon-containing conductive material, and the first and second dielectric layers are made of a silicon-containing dielectric material.

In one embodiment, the conductive layer is made of germanium-containing polysilicon.

In one embodiment, the semiconductor substrate further comprises a silicon substrate and a CMOS device layer formed on the silicon substrate, where the CMOS device layer comprises a monocrystal silicon or metal-oxide-silicon transistor device formed therein.

In another aspect, there is provided a method for manufacturing a MEMS inertial sensor, including:
providing a semiconductor substrate comprising a first dielectric layer, a bottom induction interconnect pad and a bottom reference interconnect pad embedded at the top of the first dielectric layer;
depositing a first carbon layer on the first dielectric layer;
patterning the first carbon layer to form a plurality of openings to expose the bottom induction interconnect pad and the bottom reference interconnect pad;
depositing a silicon-containing conductive layer on the first carbon layer, which fills the openings, covers the first carbon layer, and is electrically connected to the exposed bottom induction interconnect pad and bottom reference interconnect pad;
selectively etching the silicon-containing conductive layer to form a first fixed electrode, an inertial electrode and a connection electrode which is connected to the inertial electrode, wherein the first fixed electrode and the inertial electrode constitute a capacitor, and the connection electrode works as a support body for the inertial electrode; the first fixed electrode is arranged on and connected to the fixed anchor bolt, and at least one of the first fixed electrode is electrically connected to the bottom induction interconnect pad through the fixed anchor bolt; the connection electrode is connected to the inertial anchor bolt and is electrically connected to the bottom reference interconnect pad through the inertial anchor bolt;
forming a bottom sealing ring and a MEMS peripheral support body on the bottom sealing ring, where the bottom sealing ring and the MEMS peripheral support body form an integral structure;
forming a second carbon layer on the first fixed electrode, the inertial electrode, the connection electrode and a portion of the MEMS peripheral support body, and forming a top sealing ring surrounding the second carbon layer and on a portion of the MEMS peripheral support body;
forming a sealing cap layer on the second carbon layer and the top sealing ring, and etching the sealing cap layer to form an opening therein;
removing the first carbon layer and the second carbon layer through the opening in the sealing cap layer; and
filling the opening in the sealing cap layer.

In one embodiment, the silicon-containing conductive layer comprises polysilicon, amorphous silicon, silicon-germanium polysilicon or amorphous silicon-germanium, and is deposited by CVD or PVD.

In another aspect, there is provided a method for manufacturing a MEMS inertial sensor, including:
providing a semiconductor substrate comprising a first dielectric layer, a bottom induction interconnect pad and a bottom reference interconnect pad embedded at the top of the first dielectric layer;
depositing a first carbon layer as a sacrificial layer on the first dielectric layer;
patterning the first carbon layer to form a plurality of openings therein, the plurality of openings exposing the bottom induction interconnect pad and the bottom reference interconnect pad;
filling the openings with a conductive material, so as to form a fixed anchor bolt, an inertial anchor bolt and a bottom sealing ring;
depositing an additional conductive layer on the first carbon layer, the fixed anchor bolt, the inertial anchor bolt and the bottom sealing ring, the additional conductive layer being electrically connected to the fixed anchor bolt and the inertial anchor bolt;
selectively etching the additional conductive layer to form a first fixed electrode, an inertial electrode and a connection electrode which is connected to the inertial electrode, wherein the first fixed electrode and the inertial electrode constitute a capacitor, and the connection electrode works as a support for the inertial electrode; the first fixed electrode is arranged on and connected to the fixed anchor bolt, and at least one of the first fixed electrode is electrically connected to the bottom induction interconnect pad through the fixed anchor bolt; the connection electrode is connected to the inertial anchor bolt and is electrically connected to the bottom reference interconnect pad through the inertial anchor bolt;
forming a MEMS peripheral support body on the bottom sealing ring, the MEMS peripheral support body being connected to the bottom sealing ring;
forming a second carbon layer on the first fixed electrode, the inertial electrode, the connection electrode and a portion of the MEMS peripheral support body, and forming a top sealing ring surrounding the second carbon layer and on a portion of the MEMS peripheral support body;

forming a sealing cap layer on the second carbon layer and the top sealing ring, and etching the sealing cap layer to form an opening therein;

removing the first carbon layer and the second carbon layer through the opening in the sealing cap layer; and filling the opening in the sealing cap layer.

In one embodiment, the additional conductive layer comprises polysilicon, amorphous silicon, silicon-germanium polysilicon or amorphous silicon-germanium, and is deposited by CVD or PVD.

In one embodiment, the fixed anchor bolt and the inertial anchor bolt comprise polysilicon, amorphous silicon, silicon-germanium polysilicon or amorphous silicon-germanium, and are deposited by CVD or PVD.

In one embodiment, the additional conductive layer may be a single layer including titanium alloy, or a multi-layer including titanium alloy, or a multi-layer including titanium and a dielectric material, or a multi-layer including aluminium alloy, or a multi-layer including aluminium and a dielectric material. The additional conductive layer may be formed by CVD, or PVD, or both.

Compared with the conventional art, the present disclosure has the following advantages:

In a MEMS inertial sensor provided in embodiments of the present disclosure, a carbon layer is employed as a sacrificial layer under a movable inertial electrode, an anchor blot is employed to fix a first fixed electrode, and the anchor bolt will not be removed when the sacrificial layer is removed to form a cavity, thus, each plate of the first fixed electrode may be fixed firmly, only the inertial electrode will move under an inertial force, and the first fixed electrode will almost not move or vibrate. However, in the conventional art, a silicon compound is employed as the sacrificial layer for the movable inertial electrode, and when removing silicon compound layer, the sacrificial layer for the fixed electrode may also be removed. Although the fixed electrode in the conventional art employs a hard material and is not likely to move compared with the inertial electrode, it still may vibrate under an inertial force, which may cause an error.

In embodiments of the present disclosure, the sacrificial layer is formed by deposition at a low temperature and a low pressure, therefore no damages will be caused to a MOS circuit at the bottom, and a three dimensional structure including the MOS circuit and the inertial sensor may be formed, which decreases the area of an inertial sensor chip greatly and facilitate packaging.

BRIEF DESCRIPTION OF THE DRAWINGS

The accompanying drawings, which are incorporated in and form a part of the specification, illustrate embodiments of the invention. The above-mentioned and other objectives, features and advantages of the present disclosure will become clearer through the description with attached drawings.

DETAILED DESCRIPTION OF THE DISCLOSURE

Hereunder, the present disclosure will be described in detail with reference to embodiments, in conjunction with the accompanying drawings.

More examples are provided hereinafter to describe the disclosure. However, it shall be appreciated by those skilled in the art that alternative ways may be made without deviation from the scope of the invention. Therefore the disclosure is not limited within the embodiments described here.

Considering the drawbacks of the conventional art, thin film technology is employed to form one or more separate inertial electrodes and fixed electrodes, so as to measure the movements of the inertial electrodes relative to a carrier in the horizontal or vertical direction. The inertial electrodes hang over the carrier, which forms one or more groups of capacitors. The present disclosure improves the material and manufacturing process of the sacrificial layer, so that the fixed electrodes may be effectively fixed. Besides, the present disclosure improves the conventional manufacturing process so that the sacrificial layer, which is formed and then patterned and removed to form suspended inertial electrodes, may be compatible with the CMOS technology, thus MEMS inertial sensors may be manufactured on a same silicon substrate with CMOS ROIC using thin film technology.

Figure 1:
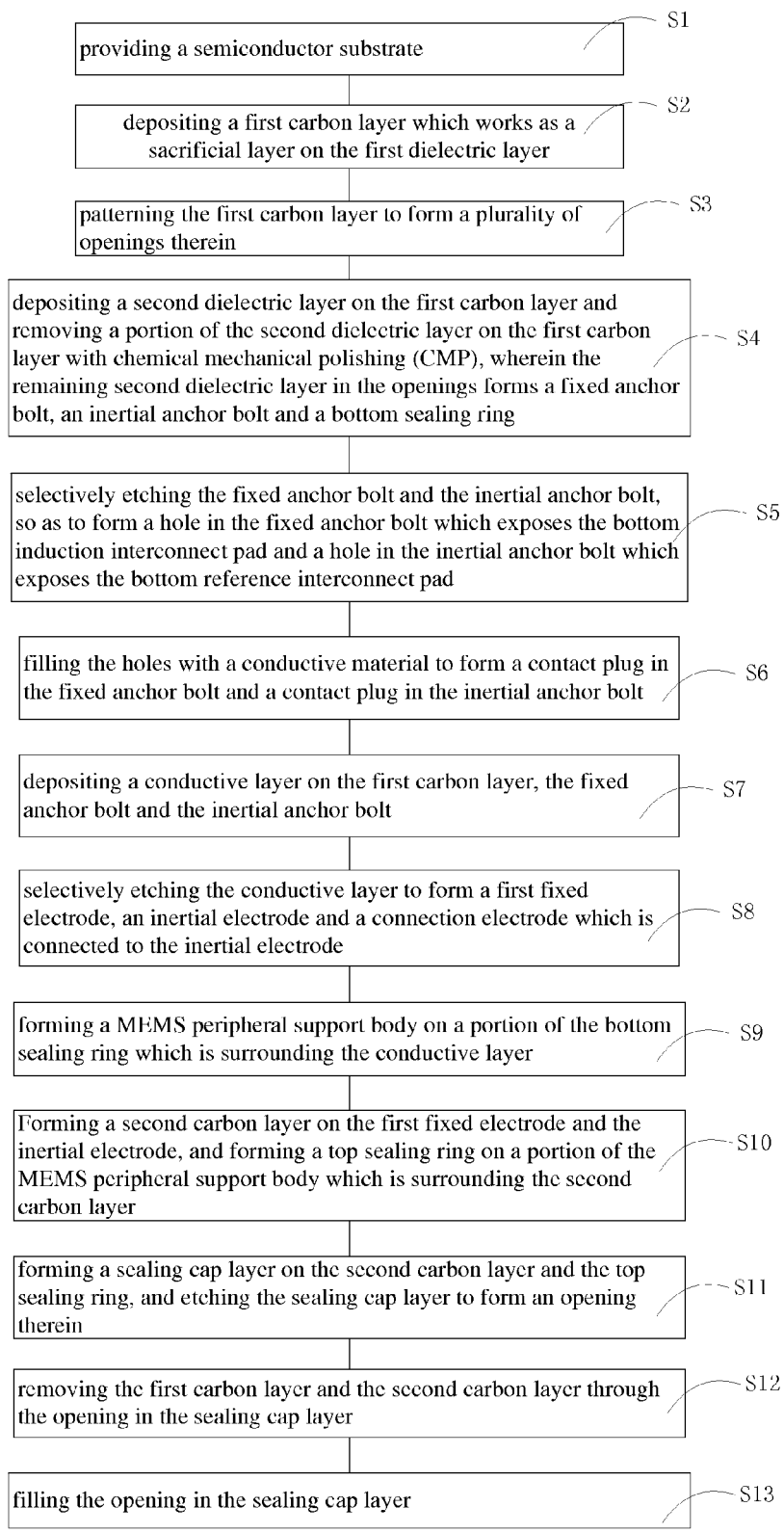
FIG. 1 schematically illustrates a flow char of a method for manufacturing a MEMS inertial sensor according to one embodiment of the present disclosure.

FIG. 1 schematically illustrates a flow char of a method for manufacturing a MEMS inertial sensor according to one embodiment of the present disclosure. Hereinafter, the method for manufacturing a MEMS inertial sensor and structures of the MEMS inertial sensor will be disclosed in detail in conjunction with FIG. 1.

Figure 2:
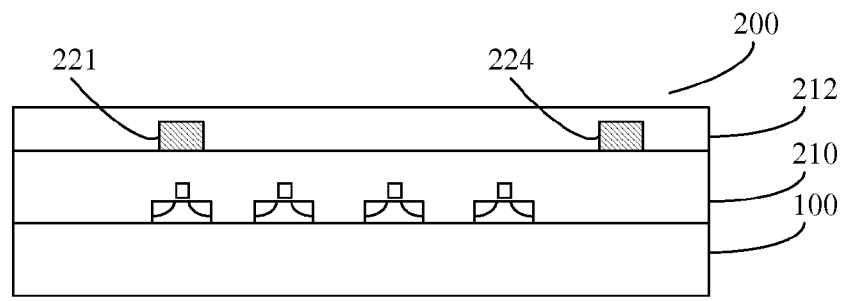
FIG. 2 to FIG. 13 are cross-sectional views of a MEMS inertial sensor schematically illustrating a method for manufacturing a MEMS inertial sensor according to one embodiment of the present disclosure.

Referring to FIG. 2, a step S1 is performed to provide a semiconductor substrate 200.

The semiconductor substrate 200 includes a first dielectric layer, a bottom induction interconnect pad 221 and a bottom reference interconnect pad 224 embedded at the top of the first dielectric layer. In one embodiment, the semiconductor substrate 200 includes a silicon substrate 100, a CMOS device layer 210 formed on the silicon substrate 100. The CMOS device layer 210 includes a monocrystalline silicon or metal-oxide-silicon transistor device. A first dielectric layer 212 is formed on the CMOS device layer 210. The bottom induction interconnect pad 221 and the bottom reference interconnect pad 224 are embedded at the top of the first dielectric layer 212. The bottom induction interconnect pad 221 is adapted for connecting a first fixed electrode and measuring the electrical property change of the first fixed electrode. The bottom reference interconnect pad 224 is adapted for connecting a connecting electrode and measuring the electrical property change of an inertial electrode through the connecting electrode. The bottom induction interconnect pad 221 and the bottom reference interconnect pad 224 may include metal, such as aluminum, titanium, copper, cobalt, nickel, tantalum, platinum, silver and gold.

Figure 3:
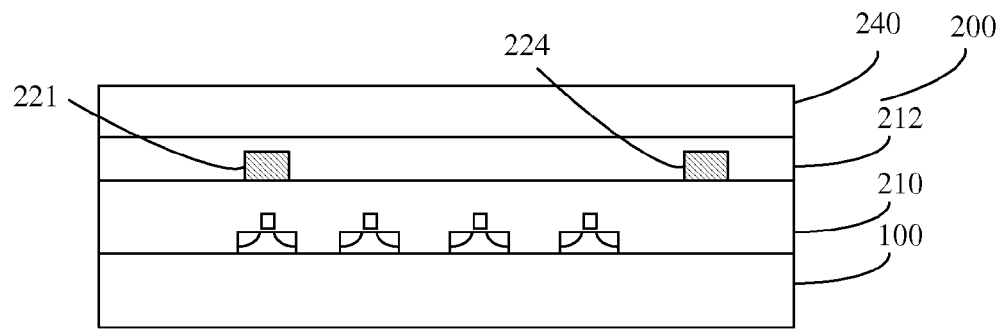

Referring to FIG. 3, a step S2 is performed to deposit a first carbon layer 240 on the first dielectric layer 212 as a sacrificial layer.

In one embodiment, the first carbon layer 240 includes amorphous carbon and is formed by chemical vapor deposition (CVD). Specifically, a plasma enhanced chemical vapor deposition process is employed to form the amorphous carbon layer, where the temperature is ranged from 350° C. to 450° C., the pressure is ranged from 1 torr to 20 torr, RF power is ranged from 800 W to 1500 W, the reactant gas includes $C_3H_6$ and He, the gas flow rate is ranged from 1000 sccm to 3000 sccm, and the ratio between $C_3H_6$ and He is ranged from 2:1 to 5:1. The first carbon layer 240 works as a sacrificial layer to be removed later.

Figure 4:
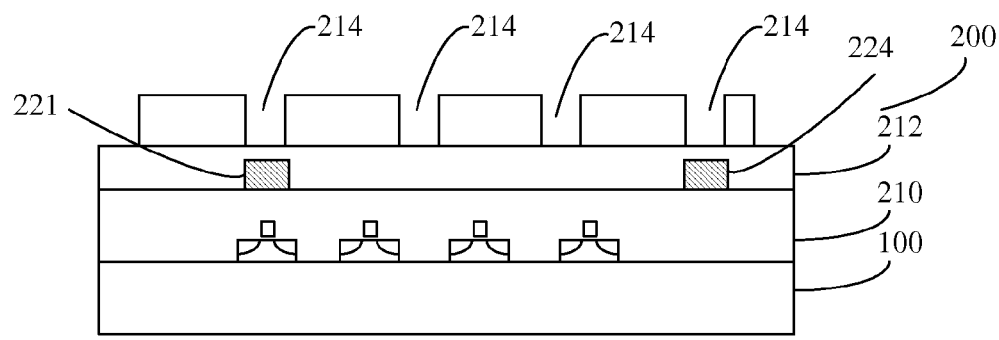

Referring to FIG. 4, a step S3 is performed to pattern the first carbon layer 240 to form multiple openings therein.

The process for patterning the first carbon layer 240 includes: forming a mask layer (such as a photoresist layer) on the first carbon layer 240 which exposes a portion of the first carbon layer 240 to be etched, dry etching the first carbon layer 240 to form multiple openings 214 therein. In subsequent steps, multiple fixed anchor bolts which are adapted for fixing the first fixed electrode and multiple inertial anchor blots which are adapted for fixing the connecting electrode will be formed in the openings. It should be noted that at least one opening is formed above the bottom induction interconnect pad 221 which is adapted to form a contact plug in one of the fixed anchor bolts formed later, where the contact plug is adapted for connecting the bottom induction interconnect pad 221. And at least one opening is formed above the bottom reference interconnect pad 224 which is adapted to form a contact plug in one of the inertial anchor bolts formed later, where the contact plug is adapted for connecting the bottom reference interconnect pad 224. In one embodiment, the first fixed electrode has a finger structure, for example, with three fingers. In order to fix the first fixed electrode firmly, a fixed anchor bolt is formed under each finger, that is, multiple openings (such as three) which are adapted to form the multiple fixed anchor bolts will be formed in this step, where one of them is formed above the bottom induction interconnect pad 221. Then the mask layer on the carbon layer is removed by etching, such as wet etching.

Figure 5:
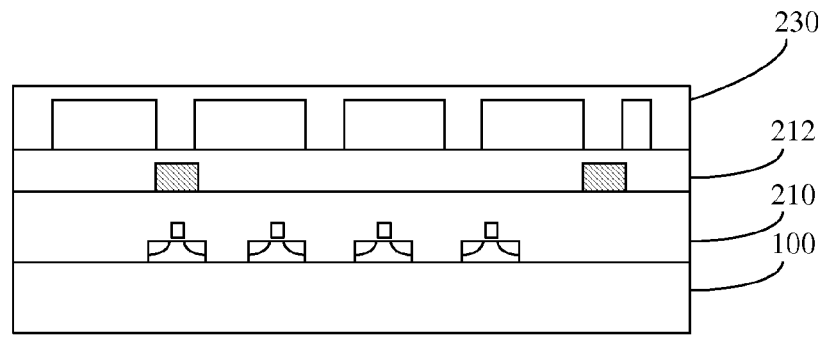
Figure 6:
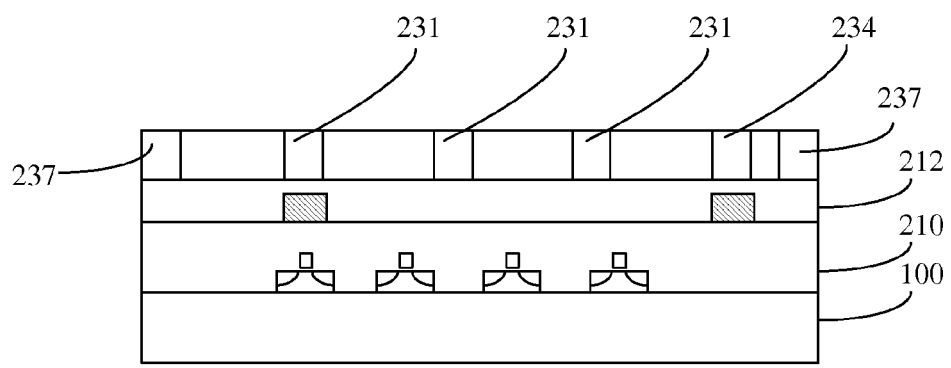

Referring to FIG. 5 and FIG. 6, a step S4 is performed to form a second dielectric layer 230 on the first carbon layer 240 by deposition and remove a portion of the second dielectric layer 230 on the first carbon layer 240 by chemical mechanical polishing (CMP). The remaining portion of the second dielectric layer 230 fills the multiple openings to form a fixed anchor bolt 231, an inertial anchor bolt 234 and a bottom sealing ring 237. The fixed anchor bolt 231, the inertial anchor bolt 234 and the bottom sealing ring 237 constitute a bottom dielectric sealing layer.

In one embodiment, the second dielectric layer 230 includes silicon oxide or silicon nitride, and is formed by CVD which is well known to those skilled in the art and will not be described in detail here. Deposition is performed until the openings are filled and then the portion of the second dielectric layer on the top of the first carbon layer 240 is removed by CMP until the remaining portion of the second dielectric layer levels with the first carbon layer 240.

In one embodiment, a portion of the first carbon layer 240 which is surrounding the semiconductor substrate 200 is also etched when a portion of the first carbon layer 240 which is on the semiconductor substrate 200 is etched, thus after polishing the second dielectric layer 230, the bottom sealing ring 237 will be formed surrounding the semiconductor substrate 200.

Figure 7:
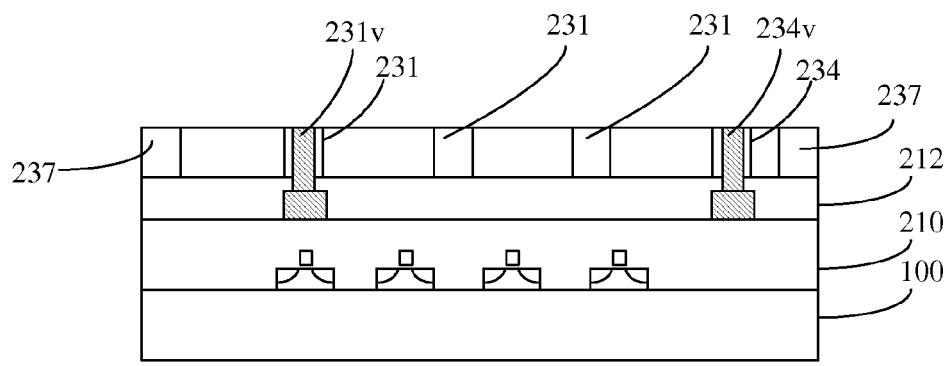

Referring to FIG. 7, a step S5 is performed to etch the fixed anchor bolt 231 and the inertial anchor bolt 234 selectively to form contact openings therein. The contact openings expose the bottom induction interconnect pad 221 and the bottom reference interconnect pad 221.

Specifically, the selective etching includes: performing selective etching with a mask layer or with a gas which is not damaging to the first carbon layer until the bottom induction interconnect pad 221 and the bottom reference interconnect pad 221 are exposed. The process is well known to those skilled in the art and will not be described in detail here.

Figure 8:
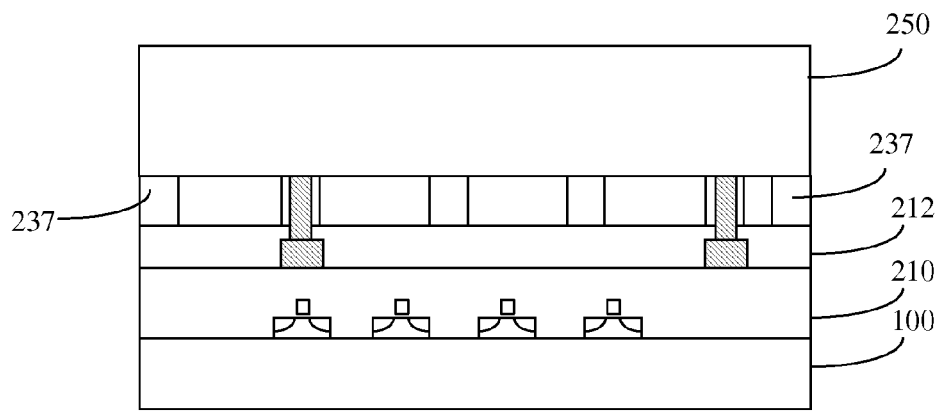

Referring to FIG. 8, a step S6 is performed to fill the contact openings with a conductive material to form a contact plug 231v in the fixed anchor bolt 231 and a contact plug 234v in the inertial anchor bolt 234.

In one embodiment, a metal layer is deposited on the first carbon layer 240 and the second dielectric layer 230. Material of the metal layer may be aluminum, copper or tungsten which are generally used in a interconnect structure. Then a portion of the metal layer which is on the first carbon layer 240 and the second dielectric layer 230 is removed by polishing, while a portion of the metal layer in the contact openings are kept which forms the contact plug 231v in the fixed anchor bolt 231 and the contact plug 234v in the inertial anchor bolt 234. Material of the contact plugs may be aluminum, titanium, copper, cobalt, nickel, tantalum, platinum, silver or gold, or a semiconductor material.

Referring to FIG. 8, a step S6 is performed to deposit a conductive layer on the first carbon layer 240, the fixed anchor bolt 231 and the inertial anchor bolt 234.

In one embodiment, material of the conductive layer may include a semiconductor material, such as polysilicon, or a metal, such as aluminum or copper. The conductive layer is adapted to form the first inertial electrode and the first fixed electrode, therefore the conductive layer is a MEMS sensing layer 250. In one embodiment, the MEMS sensing layer 250 includes a silicon-containing conductive material, and may be formed by chemical vapor deposition (CVD) or physical vapor deposition (PVD). The first dielectric layer and the second dielectric layer include a silicon-containing dielectric layer and may be formed by CVP or PVD.

In one embodiment, the silicon-containing conductive material may be polysilicon and may be formed by CVP or PVD at a temperature lower than 450° C.

In one exemplary embodiment, the conductive layer includes germanium-containing polysilicon and is formed by low pressure CVD and at a temperature lower than 450° C. Because the conductive layer is formed at low pressure and low temperature, the interconnect circuit and MOS circuit under the conductive layer will not be damaged.

In one embodiment, material of the conductive layer includes metal, such as a single layer including titanium alloy, or a multi-layer including titanium alloy, or a multi-layer including titanium and a dielectric material, or a multi-layer including aluminium alloy, or a multi-layer including aluminium and a dielectric material. The conductive layer may be formed by CVD, or PVD, or both.

In one embodiment, the steps S6 and S7 may be performed simultaneously, namely, forming the conductive layer on the first carbon layer, the fixed anchor bolt, the inertial anchor bolt, the exposed bottom induction interconnect pad and the exposed bottom reference interconnect pad by deposition, and the conductive layer filling the contact openings to form the contact plugs.

Figure 9:
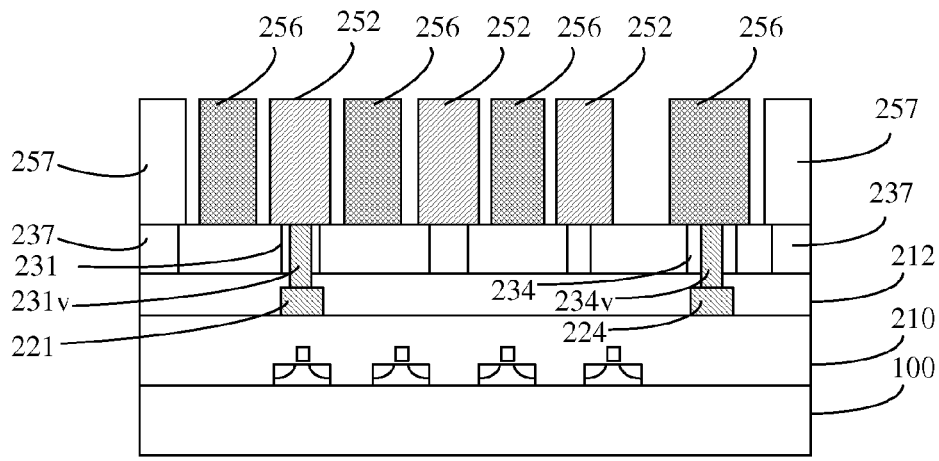
Figure 10:
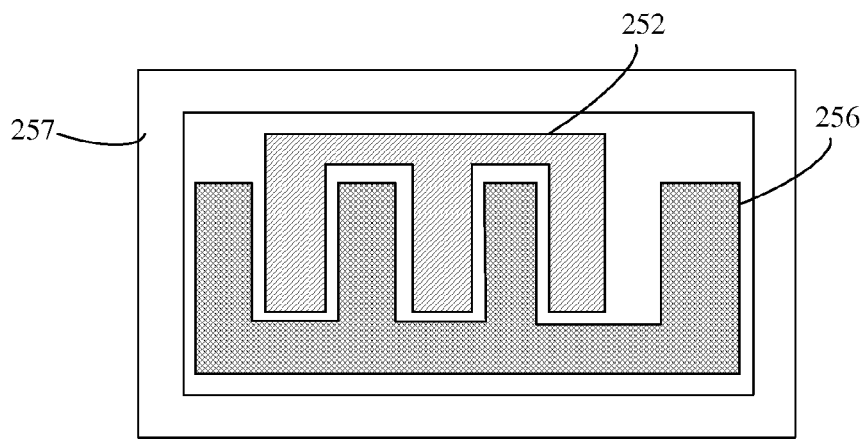

Referring to FIG. 9 and FIG. 10 (FIG. 10 is a top view of FIG. 9), a step S8 is performed to etch the conductive layer (the MEMS sensing layer 250) selectively to form a first finger structure 252 and a second finger structure 254. Each of the finger structure includes a finger portion having fingers parallel to each other and a connection portion which connects the finger portion. The fingers of the first finger structure 252 and the fingers of the second finger structure 254 are disposed in an alternative and opposite manner and form an interdigitated structure. The finger portion of the first finger structure 252 is on and in contact with the fixed anchor bolt 231, and is electrically connected to the bottom induction interconnect pad 221 through the contact plug 231v. The finger portion or the connect portion of the second finger structure 254 is in contact with the inertial anchor bolt 234, and is electrically connected to the bottom reference interconnect pad 224 through the contact plug 234v in the inertial anchor bolt 234.

In one embodiment, the conductive layer 250 is adapted to form the first fixed electrode (that is, the first finger structure 252) and the inertial electrode (that is, the second finger structure 254). The shape of the first fixed electrode 252 and the inertial electrode 254 may be determined according to practical requirements, as long as a surface of the first fixed electrode 252 is opposite to a surface of the inertial electrode 254, which constitute a capacitor. Because the inertial electrode is movable, the moving distance of the inertial electrode 254 under an inertial force may be obtained by measuring the capacitance change between the inertial electrode 254 and the first fixed electrode 252. In the embodiment, the first fixed electrode 252 and the inertial electrode 254 are configured with a finger structure, so as to increases the surface area of the capacitor. The finger structure includes a finger portion having fingers parallel to each other and a connection portion which connects the finger portion. The fingers of the first finger structure 252 and the fingers of the second finger structure 254 are disposed in an alternative and opposite manner and form an interdigitated structure, so that a finger of the first finger structure 252 is opposite to a finger of the second finger structure 254. In other embodiments, two fingers of the inertial electrode 254 may be configured in two adjacent fingers of the first fixed electrodes 252, or two fingers of the first fixed electrodes 252 may be configured in two adjacent fingers of the inertial electrode 254, thus further increasing the surface area of the capacitor and improving the measuring accuracy.

In one embodiment, the finger portion of the first finger structure 252 is on and in contact with the fixed anchor bolt 231, and one finger of the finger portion is electrically connected to the bottom induction interconnect pad 221 through the contact plug 231v. One finger of the finger portion or the connect portion of the second finger structure 254 is in contact with the inertial anchor bolt 234, and is electrically connected to the bottom reference interconnect pad 224 through the contact plug 234v in the inertial anchor bolt 234. For example, the outmost finger of the second finger structure is a connection electrode 256 and is connected to the inertial anchor bolt 234, which works as the supporter of the first inertial electrode 254. The outmost finger of the second finger structure is also connected to the bottom reference interconnect pad 224 through the contact plug 234v in the inertial anchor bolt, so that the electrical property change of the first electrode 254 may be obtained by measuring the bottom reference interconnect pad 224.

The etching process is well known to those skilled in the art and will not be described in detail here.

In one embodiment, the entire bottom of the first fixed electrode is connected to the fixed anchor bolt 231. In other embodiments, only a portion of the first fixed electrode is connected to the fixed anchor bolt 231. For example, a fixed anchor bolt which has a columnar shape is configured under the finger portion of the first fixed electrode, which plays a role of fixing the first fixed electrode; or a fixed anchor bolt which has a same shape with the first fixed electrode is configured under the first fixed electrode.

Referring to FIG. 9 and FIG. 10, a step S9 is performed to form a peripheral support body 257 on a portion of the bottom sealing ring 237 which is surrounding the conductive layer 250.

In one embodiment, the process for forming the peripheral support body 257 includes: etching a portion of the conductive layer 250 which is corresponding to the bottom sealing ring 237 so as to form a trench, depositing a dielectric layer, such as silicon oxide or silicon nitride, and then removing a portion of the dielectric layer which is at the top of the conductive layer by a polishing process.

In one embodiment, this step is performed before the step S7. Specifically, the process for forming the peripheral support body 257 includes: forming a dielectric layer on the first carbon layer 240, and then etching a portion of the dielectric layer while keeping the portion which is on the bottom sealing ring 237. In another embodiment, this step is performed simultaneously with the step S8, where the peripheral support body, which is composed of a portion of the conductive layer, is formed by etching the conductive layer.

Figure 11:
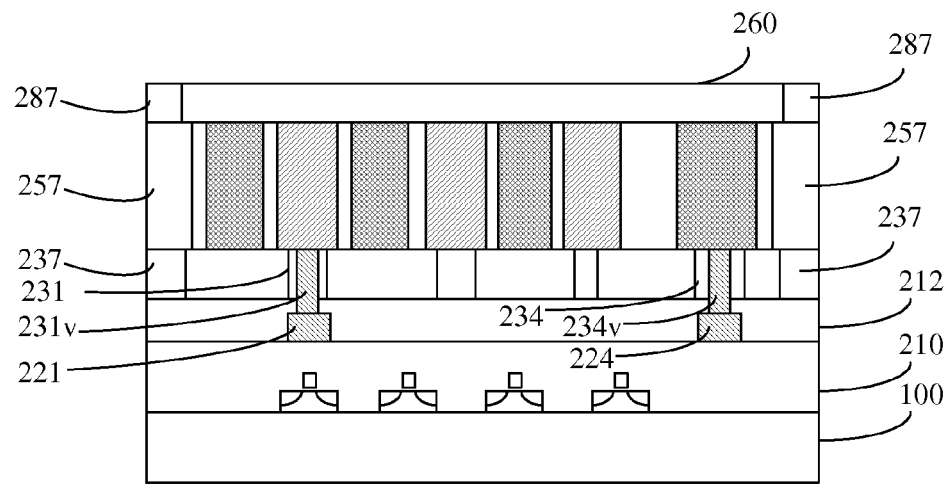

Referring to FIG. 11, a step S10 is performed to form a second carbon layer 260 on the first finger structure 252, the second finger structure 254 and the MEMS peripheral support body 257 and form a top sealing ring 287 on a portion of the MEMS peripheral support body 257 which is surrounding the second carbon layer 260. The second carbon layer 260 works as a cover layer.

In one embodiment, the second carbon layer 260 includes amorphous carbon and is formed by CVD. Specifically, the amorphous carbon layer is formed by plasma-enhanced CVD, and the plasma-enhanced CVD has a temperature ranged from 350° C. to 450° C., a pressure ranged from 1 torr to 20 torr, a RF power ranged from 800 W to 1500 W, a reactant gas including $C_3H_6$ and He, a gas flow rate ranged from 1000 sccm to 3000 sccm, and the ratio between $C_3H_6$ and He ranged from 2:1 to 5:1. The second carbon layer works as a sacrificial layer to be removed later. Then a portion of the second carbon layer which is on the MEMS peripheral support body 257 is etched with a mask to form a dielectric layer on the MEMS peripheral support body 257, where the dielectric layer works as the top sealing ring 287 and seals the cavity.

In another embodiment, the top sealing ring 287 is formed before the second carbon layer 260. For example, after depositing the carbon layer, a portion of the carbon layer which is at the top of the top sealing ring 287 is removed by polishing.

Figure 12:
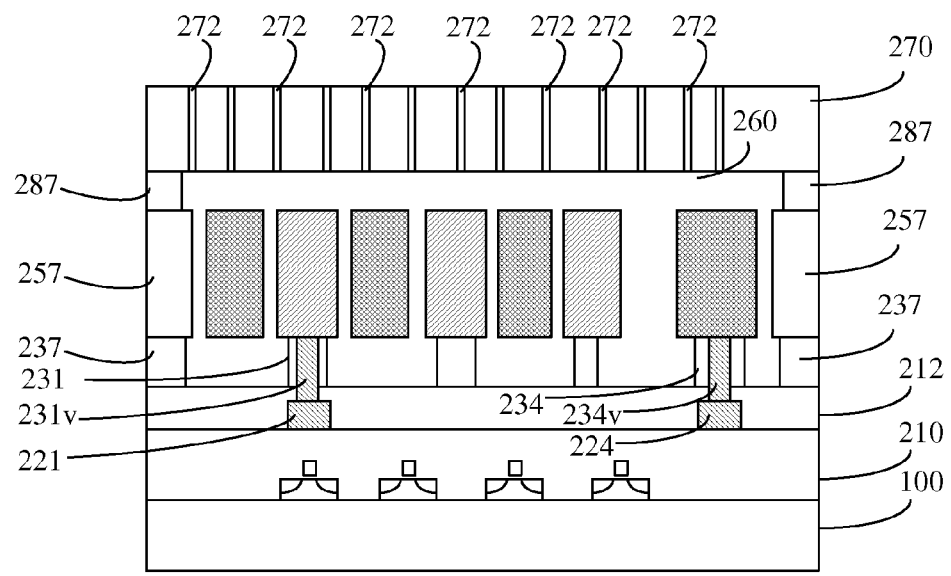

Referring to FIG. 12, a step S11 is performed to form a sealing cap layer 270 on the second carbon layer 260 and the top sealing ring 287, and to form an opening 272 by etching the sealing cap layer 270.

In one embodiment, a dielectric layer, such as silicon oxide or silicon nitride, is deposited on the top sealing ring 287 to work as the sealing cap layer 270, and the sealing cap layer 270 is etched to form the opening 272.

Referring to FIG. 12, a step S12 is performed to remove the first carbon layer 240 and the second carbon layer 250 using the opening 272.

Specifically, a cleaning or ashing process is performed through the opening 272 to remove the first carbon layer 240 and the second carbon layer 250, where the ashing process may be performed with oxygen or nitrogen plasma.

Referring to FIG. 12, a step S13 is performed to fill the opening 272.

In one embodiment, a dielectric layer is filled in the opening 272 by CVD or PVD, and the dielectric layer may include TEOS, FSG, SiON, Si3N4, SiC, and so on. A sealed cavity is formed with The sealing cap layer 270, the top sealing ring 287, the MEMS peripheral support body 257, the bottom sealing ring 237 and the semiconductor substrate 200, in which a sensing device of the MEMS inertial sensor may be located.

According to the method for manufacturing a MEMS inertial sensor disclosed in the above embodiments, a carbon layer is employed as a sacrificial layer for a movable inertial electrode, and silicon oxide or silicon nitride is employed as an anchor bolt for fixing a first fixed electrode, therefore, the anchor bolt will not be removed when removing the sacrificial layer to form the cavity, thus each plate of the first fixed electrode can be fixed firmly, only the inertial electrode will move under an inertial force, and the first fixed electrode will not move. However, in the conventional art, a silicon compound is employed as the sacrificial layer for a movable inertial electrode, and when removing silicon compound layer, the sacrificial layer for a fixed electrode may also be removed. Although the fixed electrode in the conventional art includes a hard material and is not likely to move compared with the inertial electrode, it still may vibrate under an inertial force, which may cause an error.

It should be noted that although only a bottom induction interconnect pad and a bottom reference interconnect pad is provided in the above embodiments, the number of the interconnect pads should not be limited thereto, and in other embodiments, multiple bottom reference interconnect pads or multiple bottom induction interconnect pads may be provided according to practical requirements.

It should be noted that the shapes of the fixed electrode and the inertial electrode is not limited by the above embodiments, in other embodiments, they may have other structures, as long as the inertial electrode is movable and may constitute a capacitor with the fixed electrode. For example, the fixed electrode and the inertial electrode are flat plates which are opposite to each other.

Figure 13:
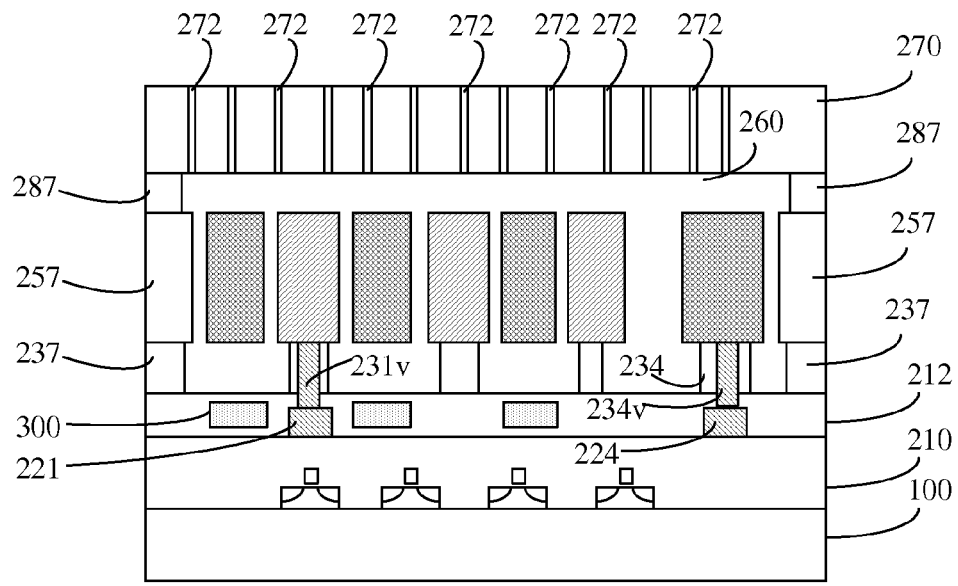

Referring to FIG. 13, in another embodiment, in a direction perpendicular to the semiconductor substrate, a second fixed electrode 300 is formed in the semiconductor substrate or formed between the semiconductor substrate and the inertial electrode. A surface of the second fixed electrode 300 which is parallel to the surface of the semiconductor substrate is opposite to a surface of the inertial electrode which is parallel to the surface of the semiconductor substrate, which constitutes a capacitor. When an inertial force is exerted in a direction perpendicular to the semiconductor substrate, the inertial electrode moves along the direction perpendicular to the semiconductor substrate. Therefore, by measuring the capacitance change between the first fixed electrode and the inertial electrode and the capacitance change between the second fixed electrode 300 and the inertial electrode, the movement distance of the inertial electrode may be obtained, so does the inertial force. In another embodiment, the second fixed electrode may be formed above the inertial electrode. For example, a dielectric layer may be formed on the inertial electrode and the second fixed electrode may be embedded in the dielectric layer.

In the above embodiments, because the sacrificial layer is formed by deposition at a low temperature and a low pressure, no damages will be caused to the a MOS circuit at the bottom, and a three dimensional structure including the MOS circuit and the inertial sensor may be formed, which decreases the area of an inertial sensor chip greatly and brings convenience to packaging.

Correspondingly, a MEMS inertial sensor manufactured with the method described in the above embodiments is provided in this disclosure. The MEMS inertial sensor includes:

A semiconductor substrate, including a first dielectric layer, a bottom induction interconnect pad and a bottom reference interconnect pad embedded at the top of the first dielectric layer;

A bottom dielectric sealing layer on the semiconductor substrate, including a bottom sealing ring formed at a position corresponding to the periphery of the semiconductor substrate, one or more fixed anchor bolts and an inertial anchor bolt in the bottom sealing ring, at least one fixed anchor bolt being electrically connected to the bottom induction interconnect pad, and the inertial anchor bolt being electrically connected to the bottom reference interconnect pad;

An inertial electrode, a connection electrode and a first fixed electrode configured on the bottom dielectric sealing layer, where the inertial electrode and the first fixed electrode which are opposite to each other constitute a capacitor, the inertial electrode is connected to the connection electrode which is configured on the inertial anchor bolt and electrically connected to the bottom reference interconnect pad; the inertial electrode hangs over the semiconductor substrate supported by the connection electrode; the first fixed electrode is configured on the fixed anchor bolt and electrically connected to the bottom reference interconnect pad; and a MEMS peripheral support body which is connected to the bottom sealing ring is arranged at a position corresponding to the bottom sealing ring;

A top sealing ring on the MEMS peripheral support body;

A sealing cap layer on the top sealing ring, the first fixed electrode, the inertial electrode and the connection electrode.

A sealed cavity is formed with the sealing cap layer, the top sealing ring, the MEMS peripheral support body, the bottom sealing ring and the semiconductor substrate. Under an inertial force, the inertial electrode may move along a direction perpendicular to a surface of the semiconductor substrate or along a direction perpendicular to a surface of the first fixed electrode which is opposite to the inertial electrode, which makes the capacitance between the inertial electrode and the first fixed electrode change.

In one embodiment, at least one fixed anchor bolt has a contact plug formed therein and the contact plug is connected to the bottom induction interconnect pad. And the inertial anchor bolt has a contact plug formed therein and the contact plug is connected to the bottom reference interconnect pad.

The connection electrode is electrically connected to the bottom reference interconnect pad through the contact plug in the inertial anchor bolt, and the first fixed electrode is electrically connected to the bottom reference interconnect pad through the contact plug in the fixed anchor bolt.

In one embodiment, the fixed anchor bolt and the first fixed electrode have a same material and constitute an integrated structure, and the inertial anchor bolt and the connection electrode have a same material and constitute an integrated structure.

In one embodiment, the bottom sealing ring and the MEMS peripheral support body may be formed in a same step and constitute an integrated structure.

In one embodiment, the first fixed electrode and the inertial electrode have a finger structure which includes a finger portion having multiple fingers parallel to each other and a connection portion. The fingers of the first fixed electrode and the fingers of the inertial electrode are disposed in an alternative and opposite manner and form an interdigitated structure.

In one embodiment, at least two fingers of the inertial electrode are arranged in two adjacent fingers of the first fixed electrode, or at least two fingers of the first fixed electrode are arranged in two adjacent fingers of the inertial electrode.

In one embodiment, a second fixed electrode is arranged in a direction that the inertial electrode is perpendicular to a surface of the semiconductor substrate. The second fixed electrode and the inertial electrode constitute a capacitor which is perpendicular to the surface of the semiconductor substrate.

In one embodiment, material of the conductive layer may be a silicon-containing conductive material, and material of the first and second dielectric layers may be a silicon-containing dielectric material.

In one embodiment, material of the conductive layer may be a silicon-containing conductor a germanium-containing polysilicon.

In one embodiment, the semiconductor substrate further includes a silicon substrate and a CMOS device layer formed on the silicon substrate. The CMOS device layer has monocrystal silicon or metal-oxide-silicon transistor devices formed therein.

Figure 14:
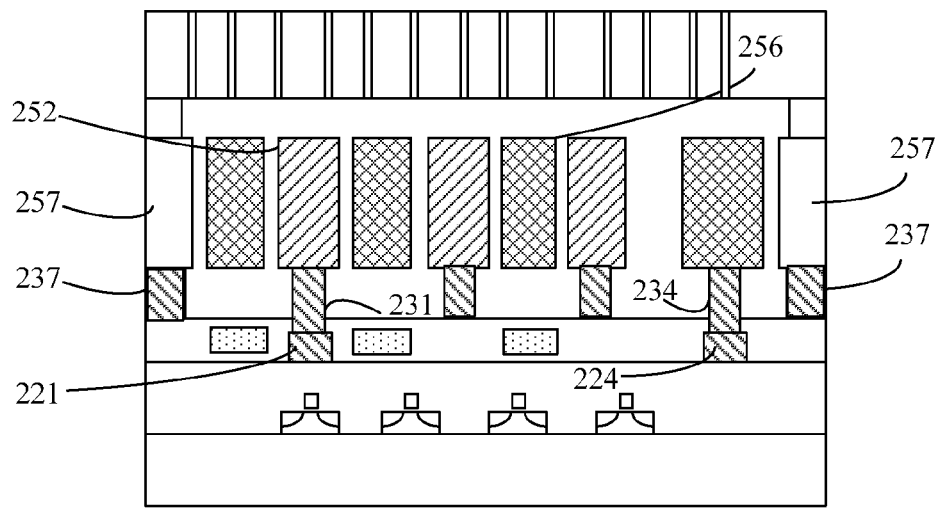
FIG. 14 is a cross-sectional view of a MEMS inertial sensor schematically illustrating a method for manufacturing a MEMS inertial sensor according to another embodiment of the present disclosure.

In another embodiment, the present disclosure provides another method for manufacturing a MEMS inertial sensor. Besides the steps S1 and S2 described in the above embodiments, the method further includes the following steps:

Referring to FIG. 14, the first carbon layer is patterned to form multiple openings which expose the bottom induction interconnect pad 221 and the bottom reference interconnect pad 224;

A silicon-containing conductive layer is deposited on the first carbon layer, which fills the openings and covers the first carbon layer. The silicon-containing conductive layer is electrically connected to the exposed bottom induction interconnect pad 221 and bottom reference interconnect pad 224.

The silicon-containing conductive layer is selectively etched to form the first fixed electrode 252, the inertial electrode 256 and the connection electrode which is connected to the inertial electrode 256. The first fixed electrode 252 is connected to the bottom induction interconnect pad 221 through a portion of the silicon-containing conductive layer in one of the openings. The connection electrode is connected to the bottom reference interconnect pad 224 through a portion of the silicon-containing conductive layer in one of the openings. The first fixed electrode 252 and the inertial electrode 256 constitute a capacitor, and the connection electrode works as a support body for the inertial electrode 256. The first fixed electrode 252 is arranged on and connected to the fixed anchor bolt 231, and at least one portion of the first fixed electrode 252 is electrically connected to the bottom induction interconnect pad 221 through the fixed anchor bolt 231. The connection electrode is connected to the inertial anchor bolt 234 and is electrically connected to the bottom reference interconnect pad 224 through the inertial anchor bolt 234. Then, the bottom sealing ring 237 and the MEMS peripheral support body 257 on the bottom sealing ring 237 are formed. The bottom sealing ring 237 and the MEMS peripheral support body 257 have an integrated structure.

In one embodiment, the silicon-containing conductive layer includes polysilicon, amorphous silicon, silicon-germanium polysilicon or amorphous silicon-germanium, and is deposited by CVD or PVD.

In one embodiment, while forming the first fixed electrode 252, the inertial electrode 256 and the connection electrode which is connected to the inertial electrode 256, the fixed anchor bolt 231 and the inertial anchor bolt 234 are formed in the same step, which simplifies the process and improves performance of the device.

In another embodiment, the present disclosure provides another method for manufacturing a MEMS inertial sensor. Besides the steps S1 and S2 described in the above embodiments, the method further includes the following steps:

Referring to FIG. 14, the first carbon layer is patterned to form multiple openings which expose the bottom induction interconnect pad 221 and the bottom reference interconnect pad 224;

The openings are filled with a conductive material, so as to form the fixed anchor bolt 231, the inertial anchor bolt 234 and the bottom sealing ring 237;

An additional conductive layer is deposited on the first carbon layer, the fixed anchor bolt 231, the inertial anchor bolt 234 and the bottom sealing ring 237. The additional conductive layer is electrically connected to the fixed anchor bolt 231 and the inertial anchor bolt 234;

The additional conductive layer is selectively etched to form the first fixed electrode 252, the inertial electrode 256 and the connection electrode which is connected to the inertial electrode 256. The first fixed electrode 252 and the inertial electrode 256 constitute a capacitor, and the connection electrode works as a support body for the inertial electrode 256. The first fixed electrode 252 is arranged on and connected to the fixed anchor bolt 231, and is electrically connected to the bottom induction interconnect pad 221 through the fixed anchor bolt 231. The connection electrode is connected to the inertial anchor bolt 234 and is electrically connected to the bottom reference interconnect pad 224 through the inertial anchor bolt 234. The MEMS peripheral support body 257 is arranged on and connected to the bottom sealing ring 237.

In one embodiment, the additional conductive layer includes polysilicon, amorphous silicon, silicon-germanium polysilicon or amorphous silicon-germanium, and is deposited by CVD or PVD.

In one embodiment, the fixed anchor bolt and the inertial anchor bolt include polysilicon, amorphous silicon, silicon-germanium polysilicon or amorphous silicon-germanium, and are deposited by CVD or PVD.

In one embodiment, the additional conductive layer may be a single layer including titanium alloy, or a multi-layer including titanium alloy, or a multi-layer including titanium and a dielectric material, or a multi-layer including aluminium alloy, or a multi-layer including aluminium and a dielectric material. The additional conductive layer may be formed by CVD, or PVD, or both.

In one embodiment, the fixed anchor bolt and the inertial anchor bolt may be connected to the bottom induction interconnect pad and the bottom reference interconnect pad respectively through a conductive material, so that the step for forming a contact plug is no longer needed, which simplifies the process. For example, a silicon-germanium polysilicon film may be deposited on the first carbon layer, the exposed bottom induction interconnect pad 221 and bottom reference interconnect pad 224 by a deposition process at a low temperature. Then, a patterning etching process may be employed to form the first fixed electrode 252, the inertial electrode 256, the connection electrode which is connected to the inertial electrode 256, and the MEMS peripheral support body 257. It should be noted that, the connection between the first fixed electrode 252 and the bottom induction interconnect pad 221 and the connection between the connection electrode and the bottom reference interconnect pad 224 are established in the same step.

Although the present disclosure has been disclosed above with reference to preferred embodiments thereof, it should be understood that the disclosure is presented by way of example only, and not intended to be limiting. Those skilled in the art can modify and vary the embodiments without departing from the spirit and scope of the present disclosure.

The invention claimed is:

1. A method for manufacturing a MEMS inertial sensor, comprising:

providing a semiconductor substrate comprising a first dielectric layer, a bottom induction interconnect pad and a bottom reference interconnect pad embedded at a top of the first dielectric layer;

depositing a first carbon layer on the first dielectric layer as a sacrificial layer;

patterning the first carbon layer to form a plurality of openings therein;

depositing a second dielectric layer on the first carbon layer and removing a portion of the second dielectric layer on the first carbon layer by chemical mechanical polishing (CMP), wherein the remaining second dielectric layer in the openings forms a fixed anchor bolt, an inertial anchor bolt and a bottom sealing ring;

selectively etching the fixed anchor bolt and the inertial anchor bolt, so as to form an opening in the fixed anchor bolt which exposes the bottom induction interconnect pad and an opening in the inertial anchor bolt which exposes the bottom reference interconnect pad;

filling the openings with a conductive material to form contact plugs and depositing a conductive layer on the first carbon layer, the fixed anchor bolt, the inertial anchor bolt and the contact plugs;

selectively etching the conductive layer to form a first fixed electrode, an inertial electrode and a connection electrode which is connected to the inertial electrode, wherein the first fixed electrode and the inertial electrode constitute a capacitor, and the connection electrode works as a support body for the inertial electrode; the first fixed electrode is arranged on and connected to the fixed anchor bolt, and is electrically connected to the bottom induction interconnect pad through the contact plug in the fixed anchor bolt; the connection electrode is connected to the inertial anchor bolt and is electrically connected to the bottom reference interconnect pad through the contact plug in the inertial anchor bolt;

forming a MEMS peripheral support body on the bottom sealing ring;

forming a second carbon layer on the first fixed electrode, the inertial electrode, the connection electrode and a portion of the MEMS peripheral support body, and forming a top sealing ring surrounding the second carbon layer and on a portion of the MEMS peripheral support body;

forming a sealing cap layer on the second carbon layer and the top sealing ring, and etching the sealing cap layer to form an opening therein;

removing the first carbon layer and the second carbon layer through the opening in the sealing cap layer; and filling the opening in the sealing cap layer.

2. The method of claim 1, wherein the step of filling the openings with a conductive material to form contact plugs and the step of depositing a conductive layer on the first carbon layer, the fixed anchor bolt, the inertial anchor bolt and the contact plugs are performed in a same step, that is, depositing a conductive layer on the first carbon layer, the fixed anchor bolt, the inertial anchor bolt and the exposed bottom induction interconnect pad and bottom reference interconnect pad.

3. The method of claim 1, wherein the first fixed electrode and the inertial electrode both has a finger structure, which comprises a finger portion having fingers parallel to each other and a connection portion connected to the finger portion, where the fingers of the first fixed electrode and the fingers of the inertial electrode are disposed in an alternative and opposite manner and form an interdigitated structure.

4. The method of claim 3, wherein at least two fingers of the inertial electrode are arranged in two adjacent fingers of the first fixed electrode, or at least two fingers of the first fixed electrode are arranged in two adjacent fingers of the inertial electrode.

5. The method of claim 1, wherein a second fixed electrode is arranged in a direction that the inertial electrode is perpendicular to a surface of the semiconductor substrate, and the second fixed electrode and the inertial electrode constitute a capacitor which is perpendicular to the surface of the semiconductor substrate.

6. The method of claim 1, wherein the conductive layer is made of a silicon-containing conductive material and is formed by chemical vapor deposition (CVD) or physical vapor deposition (PVD), and the first and second dielectric layers are made of a silicon-containing dielectric material and are formed by CVD or PVD.

7. The method of claim 6, wherein the semiconductor substrate further comprises a silicon substrate and a CMOS device layer formed on the silicon substrate, where the CMOS device layer comprises a monocrystal silicon or metal-oxide-silicon transistor device formed therein.

8. A MEMS inertial sensor formed according to the method of claim 1, comprising:
the semiconductor substrate comprising the first dielectric layer, the bottom induction interconnect pad and the bottom reference interconnect pad embedded at the top of the first dielectric layer;
a bottom dielectric sealing layer on the first dielectric layer comprising the bottom sealing ring arranged at a position of a periphery of the semiconductor substrate, where one or more fixed anchor bolts and the inertial anchor bolt are arranged in the bottom sealing ring, at least one fixed anchor bolt is electrically connected to the bottom induction interconnect pad, and the inertial anchor bolt is electrically connected to the bottom reference interconnect pad;
the inertial electrode, the connection electrode and the first fixed electrode arranged on the bottom dielectric sealing layer, where the inertial electrode and the first fixed electrode which are opposite to each other constitute the capacitor; the inertial electrode is connected to the connection electrode and hangs over the semiconductor substrate supported by the connection electrode which is arranged on the inertial anchor bolt and is electrically connected to the bottom reference interconnect pad; the first fixed electrode is arranged on the fixed anchor bolt;
the MEMS peripheral support body which is connected to the bottom sealing ring arranged at a position corresponding to the bottom sealing ring;
the top sealing ring on the MEMS peripheral support body; and
the sealing cap layer on the top sealing ring, the first fixed electrode, the inertial electrode and the connection electrode;
wherein a sealed cavity is formed with the sealing cap layer, the top sealing ring, the MEMS peripheral support body, the bottom sealing ring and the semiconductor substrate; under an inertial force, the inertial electrode may move along a direction perpendicular to a surface of the semiconductor substrate or along a direction perpendicular to a surface of the first fixed electrode which is opposite to the inertial electrode, which makes the capacitance between the inertial electrode and the first fixed electrode change.

9. The MEMS inertial sensor of claim 8, wherein at least one fixed anchor bolt comprises a contact plug formed therein which is connected to the bottom induction interconnect pad, and the inertial anchor bolt comprises a contact plug formed therein which is connected to the bottom reference interconnect pad.

10. The MEMS inertial sensor of claim 8, wherein the fixed anchor bolt and the first fixed electrode have a same material and constitute an integrated structure, and the inertial anchor bolt and the connection electrode have a same material and constitute an integrated structure.

11. The MEMS inertial sensor of claim 8, wherein the first fixed electrode and the inertial electrode have a finger structure which comprise a finger portion having multiple fingers parallel to each other and a connection portion which is connected to the finger portion, where the fingers of the first fixed electrode and the fingers of the inertial electrode are disposed in an alternative and opposite manner and form an interdigitated structure.

12. The MEMS inertial sensor of claim 11, wherein at least two fingers of the inertial electrode are arranged in two adjacent fingers of the first fixed electrode, or at least two fingers of the first fixed electrode are arranged in two adjacent fingers of the inertial electrode.

13. The MEMS inertial sensor of claim 8, wherein a second fixed electrode is arranged in a direction that the inertial electrode is perpendicular to a surface of the semiconductor substrate and embedded at the top of the first dielectric layer, and the second fixed electrode and the inertial electrode constitute a capacitor which is perpendicular to the surface of the semiconductor substrate.

14. The MEMS inertial sensor of claim 8, wherein the conductive layer is made of a silicon-containing conductive material, and the first and second dielectric layers are made of a silicon-containing dielectric material.

15. The MEMS inertial sensor of claim 8, wherein the semiconductor substrate further comprises a silicon substrate and a CMOS device layer formed on the silicon substrate, where the CMOS device layer comprises a monocrystal silicon or metal-oxide-silicon transistor device formed therein.

16. A method for manufacturing a MEMS inertial sensor, comprising:
providing a semiconductor substrate comprising a first dielectric layer, a bottom induction interconnect pad and a bottom reference interconnect pad embedded at a top of the first dielectric layer;
depositing a first carbon layer on the first dielectric layer;
patterning the first carbon layer to form a plurality of openings to expose the bottom induction interconnect pad and the bottom reference interconnect pad;
depositing a silicon-containing conductive layer on the first carbon layer, which fills the openings, covers the first carbon layer, and is electrically connected to the exposed bottom induction interconnect pad and bottom reference interconnect pad;
selectively etching the silicon-containing conductive layer to form a first fixed electrode, an inertial electrode and a connection electrode which is connected to the inertial electrode, wherein the first fixed electrode and the inertial electrode constitute a capacitor, and the connection electrode works as a support body for the inertial electrode; the first fixed electrode is arranged on and connected to a fixed anchor bolt, and at least one portion of the first fixed electrode is electrically connected to the bottom induction interconnect pad through the fixed anchor bolt; the connection electrode is connected to an inertial anchor bolt and is electrically connected to the bottom reference interconnect pad through the inertial anchor bolt;
forming a bottom sealing ring and a MEMS peripheral support body on the bottom sealing ring;
forming a second carbon layer on the first fixed electrode, the inertial electrode, the connection electrode and the MEMS peripheral support body, and forming a top sealing ring surrounding the second carbon layer and on a portion of the MEMS peripheral support body;
forming a sealing cap layer on the second carbon layer and the top sealing ring, and etching the sealing cap layer to form an opening therein;
removing the first carbon layer and the second carbon layer through the opening in the sealing cap layer; and
filling the opening in the sealing cap layer.

17. The method of claim 16, wherein the silicon-containing conductive layer comprises polysilicon, amorphous silicon, silicon-germanium polysilicon or amorphous silicon-germanium, and is deposited by CVD or PVD.

18. A method for manufacturing a MEMS inertial sensor, comprising:
providing a semiconductor substrate comprising a first dielectric layer, a bottom induction interconnect pad and a bottom reference interconnect pad embedded at a top of the first dielectric layer;
depositing a first carbon layer as a sacrificial layer on the first dielectric layer;
patterning the first carbon layer to form a plurality of openings therein, the plurality of openings exposing the bottom induction interconnect pad and the bottom reference interconnect pad;
filling the openings with a conductive material, so as to form a fixed anchor bolt, an inertial anchor bolt and a bottom sealing ring;
depositing an additional conductive layer on the first carbon layer, the fixed anchor bolt, the inertial anchor bolt and the bottom sealing ring, the additional conductive layer being electrically connected to the fixed anchor bolt and the inertial anchor bolt;
selectively etching the additional conductive layer to form a first fixed electrode, an inertial electrode and a connection electrode which is connected to the inertial electrode, wherein the first fixed electrode and the inertial electrode constitute a capacitor, and the connection electrode works as a support body for the inertial electrode; the first fixed electrode is arranged on and connected to the fixed anchor bolt, and at least one portion of the first fixed electrode is electrically connected to the bottom induction interconnect pad through the fixed anchor bolt; the connection electrode is connected to the inertial anchor bolt and is electrically connected to the bottom reference interconnect pad through the inertial anchor bolt;
forming a MEMS peripheral support body on the bottom sealing ring, the MEMS peripheral support body being connected to the bottom sealing ring;
forming a second carbon layer on the first fixed electrode, the inertial electrode, the connection electrode and the MEMS peripheral support body, and forming a top sealing ring surrounding the second carbon layer and on a portion of the MEMS peripheral support body;
forming a sealing cap layer on the second carbon layer and the top sealing ring, and etching the sealing cap layer to form an opening therein;
removing the first carbon layer and the second carbon layer through the opening in the sealing cap layer; and
filling the opening in the sealing cap layer.

19. The method of claim 18, wherein the additional conductive layer comprises polysilicon, amorphous silicon, silicon-germanium polysilicon or amorphous silicon-germanium, and is deposited by CVD or PVD.

20. The method of claim 18, wherein the fixed anchor bolt and the inertial anchor bolt comprise polysilicon, amorphous silicon, silicon-germanium polysilicon or amorphous silicon-germanium, and are deposited by CVD or PVD.

* * * * *